Feb. 24, 1970 J. R. COLTON ET AL 3,497,830
GATED OPERATIONAL AMPLIFIER
Filed March 20, 1968 2 Sheets-Sheet 1
FIG. 1
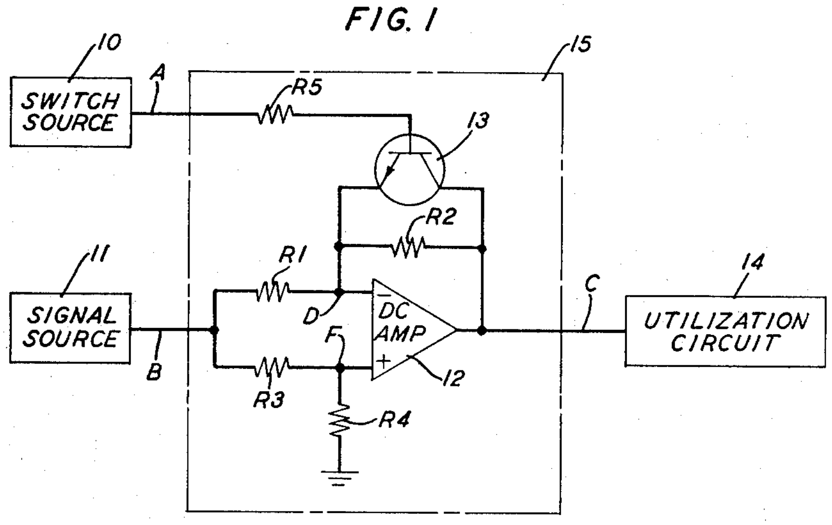
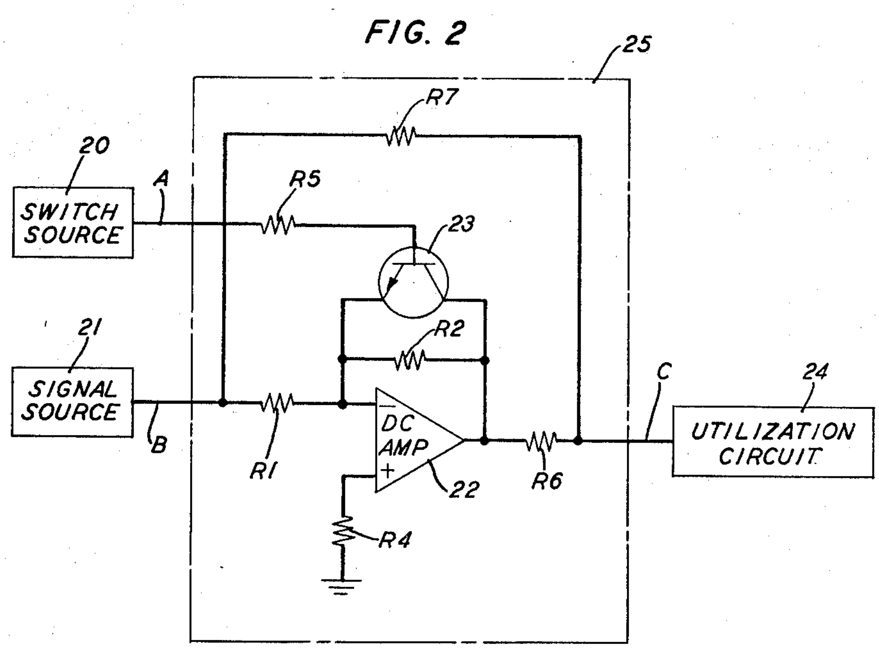
INVENTORS J. R. COLTON
J. R. SHEEHAN
P. A. VACHON
BY J. P. Kearns
ATTORNEY

GATED OPERATIONAL AMPLIFIER

Filed March 20, 1968 2 Sheets-Sheet 2

United States Patent Office 3,497,830
Patented Feb. 24, 1970

3,497,830

GATED OPERATIONAL AMPLIFIER

John R. Colton, Fords Township, Middlesex County, John R. Sheehan, Red Bank Township, Monmouth County, and Patrick A. Vachon, Howell Township, Monmouth County, N.J., assignors to Bell Telephone Laboratories, Incorporated, Murray Hill, N.J., a corporation of New York Filed Mar. 20, 1968, Ser. No. 714,545
Int. Cl. H03k *13/00, 7/00;* H03f *1/38*
U.S. Cl. 332—9 8 Claims

ABSTRACT OF THE DISCLOSURE

The versatility of the high-gain operational amplifier is enhanced by connecting a switching device in shunt of its feedback circuit. The output of the operational amplifier then becomes reversible in polarity under the control of the switching device. If the switching device is controlled by a pulse source, the operational amplifier becomes a transmission gate. If the switching device is controlled by a carrier-wave source, it becomes a transformerless modulator or demodulator. Full-wave rectifiers also become readily realizable. Pluralities of such gated operational amplifiers can be combined to effect an improved digital-to-analog converter or a multilevel encoder.

FIELD OF THE INVENTION

This invention relates to operational amplifiers and particularly to modifications of such amplifiers to perform modulation functions.

BACKGROUND OF THE INVENTION

Operational amplifiers are direct-current amplifiers with very high open-loop gains provided with a feedback impedance. Depending on the nature of the feedback element, mathematical operations of addition, subtraction, multiplication, integration and differentiation can be performed. In particular, if the feedback element between input and output points is a resistor of value $R_2$ and an input voltage $E_i$ is applied through a further resistor of value $R_1$, the voltage $E_o$ appearing at the output point will be the negative of the input voltage $E_i$ multiplied by the ratio of $R_2$ to $R_1$, that is, $$E_o = -\frac{R_2}{R_1} E_i \tag{1}$$

Operational amplifiers are generally of the inverting type in order that the feedback be in proper phase to force the input to be continually in a virtual ground state. However, since the high open-loop gain values required for successful operation indicate the use of multistage amplifiers, it is a relatively simple matter to provide another input at some intermediate amplifier stage that will be noninverting. Thus, some inputs may be made additive and others subtractive. The use of an operational amplifier with additive and subtractive inputs will be shown below to be advantageous in the practice of this invention.

Balanced modulators as known in the prior art are basically switching devices which invert signals applied to one input in accordance with the negative half-cycles of a carrier or switching wave applied to another input. The output then becomes essentially the product of the signal wave and the switching wave. A carrier wave used as the switching wave essentially functions in the manner of a high-speed square wave. Conventional means for implementing modulators are diode bridge circuits and push-pull circuits whose conduction paths are switched at the carrier rate. Such conventional modulators usually include closely balanced input and output transformers which in many cases require special balancing adjustments.

It is an object of this invention to improve switching-type modulators.

It is another object of this invention to provide a transformerless switching-type modulator.

It is still another object of this invention to adapt operational amplifiers to perform the functions of switching-type modulators.

It is yet another object of this invention to provide a switching-type modulator capable of implementation as a compact integrated electrical circuit.

SUMMARY OF THE INVENTION

According to this invention, a high-gain operational amplifier provided with inverting and noninverting input points and a negative feedback connection between an output point and the inverting input point has a modulating signal source applied to one or both of the two input points and a switching device connected across the feedback connection and controlled by a switching wave source. The effective closed-loop gain of the operational amplifier is switched between equal positive and negative values in accordance with the instantaneous polarity of the output of the switching wave source by proper choice of input and feedback impedances. The output of the modulating-wave source is in effect multiplied by the output of the switching-wave source to obtain balanced modulator action.

In one embodiment of the invention the modulating-wave source is applied in parallel to both inverting and noninverting input points through resistive networks. A positive closed-loop gain with respect to the noninverting input is balanced against a negative closed-loop gain with respect to the inverting input when the switching device is open. Only the positive closed-loop gain is effective when the switching device is closed, on the other hand. By choice of resistance values according to this invention the respective positive and negative closed-loop gains can be made substantially equal in absolute values.

In another embodiment of the invention the modulating-wave source is applied only to the inverting input and the noninverting input is maintained at a fixed level with respect to ground reference. At the same time an auxiliary nonswitched feedforward connection is made between input and output of the overall circuit and the closed-loop gain is switched between a negative value and zero under the control of the switching device. By choice of resistance values according to this invention the switchable closed-loop gains are balanced against the feedforward voltage ratio to obtain substantially equal positive and negative overall gain values. With the second embodiment the effect of offset voltages due to the presence of the switching device is reduced over that in the first embodiment.

Further in accordance with this invention either of the switching circuits of the above embodiments can be modified to function as full-wave rectifiers and gating circuits. Pluralities of either of these switching circuits can be combined with a further summing operational amplifier to function as digital-to-analog converters and multilevel digital data encoders.

An important feature of this invention is that all selectable elements for the inventive embodiments are resistive. No inductors, capacitors or transformers are required. Therefore, the modulators of the invention are adaptable to the use of integrated circuit techniques.

DESCRIPTION OF THE DRAWING

The above and other features, objects and advantages of this invention will be better appreciated by a consideration of the following detailed description and the drawing in which:

FIG. 1 is a block schematic diagram of a balanced modulator employing an operational amplifier according to this invention with the signal source connected in parallel to inverting and noninverting inputs thereof;

FIG. 2 is a block schematic diagram of a balanced modulator employing an operational amplifier according to this invention with the signal source connected only to the inverting input thereof;

DETAILED DESCRIPTION

Figure 3:
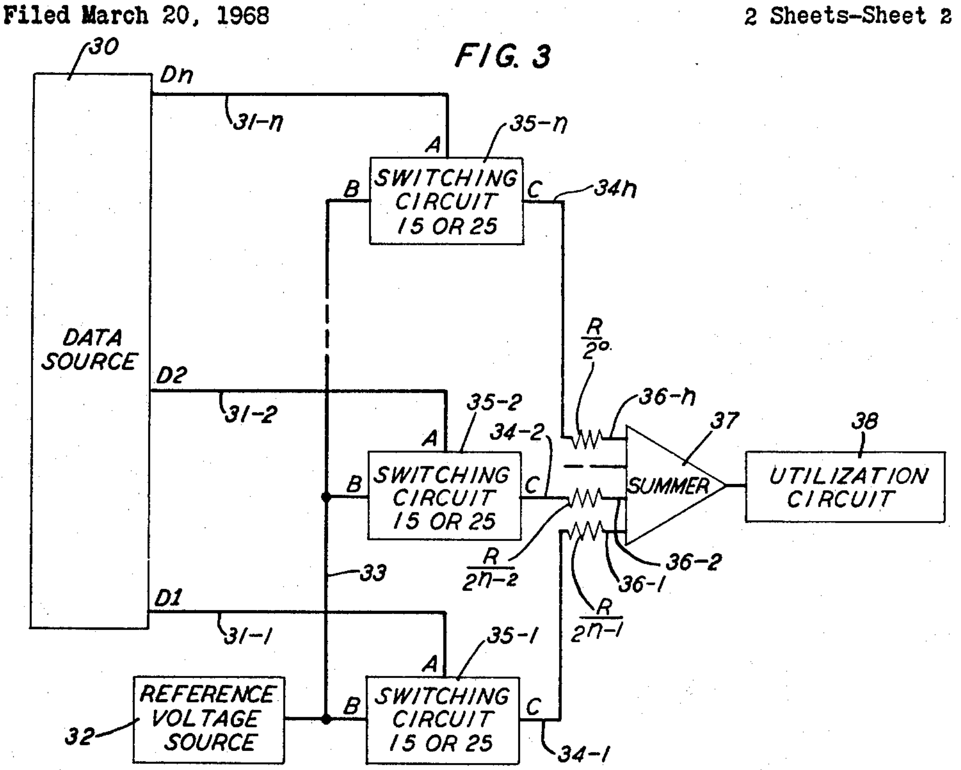
FIG. 3 is a block schematic diagram of a digital-to-analog converter employing a plurality of operational amplifier switching circuits according to this invention.

FIG. 1 is a block schematic diagram of an operational amplifier modified according to this invention to perform the function of a transformerless balanced modulator. The balanced modulator per se within broken line box 15 comprises high-gain operational amplifier 12, having an inverting input identified by the minus sign and a noninverting input identified by the plus sign, an input resistor $R_1$ between the input lead B and the inverting input of amplifier 12 and a voltage divider including resistors $R_3$ and $R_4$ between input lead B and the noninverting input point, a feedback resistor $R_2$ connected between the output of amplifier 12 (lead C) and the inverting input point; a switching device shunting feedback resistor $R_2$ and represented by junction transistor 13; and a current-limiting resistor $R_5$ connected between switching control point A and the base of transistor 13. To control point A there is connected a source 10 of switching potential; to modulating input B, a signal source 11; and to output C, a utilization circuit 14.

For operation as a balanced modulator or demodulator switch source 10 can advantageously be a carrier-wave source. Signal source 11 can be a baseband alternating- or direct-current source, if the circuit is to be a modulator; and a passband source, if the circuit is to be a demodulator. Utilization circuit 14 can be either a transmission facility for a carrier-modulated signal or a signal receiver for a demodulated signal.

The modulator of FIG. 1 can be analyzed by conventional techniques. The junctions of resistors $R_1$ and $R_2$ and resistors $R_3$ and $R_4$ are designated for the purpose of this analysis by the letters D and F respectively, as indicated on the drawing. Looking first to node D (the inverting input of amplifier 12), one can write $$\frac{E_B-E_D}{R_1}=\frac{E_D-E_C}{R_2} \qquad (2)$$

where the E's are voltages at the indicated junctions and the R's are resistance values as indicated in FIG. 1.

Equation 2 is solved for $E_D$ to yield $$E_D=\frac{E_BR_2+E_CR_1}{R_1+R_2} \qquad (3)$$

Considering next the junction F (the noninverting input of amplifier 12) one obtains $$E_F=\frac{R_4}{R_3+R_4}E_B+V_{OFF} \qquad (4)$$

where $V_{OFF}$ is defined as the equivalent input offset voltage of operational amplifier 12 resulting from both the actual input offset voltage and input offset current which may have either polarity. It is an error term.

Now look at the voltage at output point C.

$$E_C=AE_F-AE_D \qquad (5)$$

where A is the open-loop or internal gain of operational amplifier 12. This may be of the order of hundreds or thousands.

Substitution of Equations 3 and 4 into Equation 5 yields $$E_C=A\left(\frac{R_4}{R_3+R_4}E_B+V_{OFF}-\frac{R_2}{R_1+R_2}E_B-\frac{R_1}{R_1+R_2}E_C\right) \qquad (6)$$

By collecting the $E_C$ terms on both sides of Equation 6, one obtains $$E_C\left(\frac{1}{A}+\frac{R_1}{R_1+R_2}\right)=\frac{R_6}{R_3+R_4}E_B-\frac{R_2}{R_1+R_2}E_B+V_{OFF} \qquad (7)$$

In a practical circiut A is large enough for its reciprocal to be small in comparison with $R_1/(R_1+R_2)$. Then Equation 7 can be solved for $E_C$ to yield $$E_C=\left(\frac{R_4}{R_3+R_4}E_B+V_{OFF}\right)\left(1+\frac{R_2}{R_1}\right)-\frac{R_2}{R_1}E_B \qquad (8)$$

The first term in parentheses on the right side of Equation 8 represents the contribution of the noninverting gain path through amplifier 12 and the negative term, the contribution of the inverting gain path.

$V_{OFF}$ may be neglected for the moment. Let $R_2=2R_1$ and $R_3=R_4$. Then $$E_C=-\frac{E_B}{2} \qquad (9)$$

Equation 9 represents the output of the modulator of FIG. 1 when switching transistor 13 (shown here as an npn type) is reverse biased by switching source 10.

The modulator of FIG. 1 can be similarly analyzed for the condition when switching transistor 13 is saturated. Feedback resistor $R_2$ is then effectively removed from the circuit and only an error voltage drop $V_{SAT}$ appears from collector to emitter of transistor 13.

Looking again at node D, one may write $$E_D=E_C+_{SAT} \qquad (10)$$

Junction F remains in the same condition as represented above by Equation 4.

At output point C, Equation 5 again applies, but Equation 6 becomes $$E_C=A\left(\frac{R_4}{R_3+R_4}E_B-E_C+V_{OFF}-V_{SAT}\right) \qquad (11)$$

Solving for the output voltage $E_C$ yields $$E_C=\frac{A}{1+A}\left(\frac{R_4}{R_3+R_4}E_B+V_{OFF}-V_{SAT}\right) \qquad (12)$$

Neglecting the error components $V_{OFF}$ and $V_{SAT}$, letting $R_3=R_6$ as before, and assuming A is very large in comparison with unity, Equation 12 reduces to $$E_C=E_B/2 \qquad (13)$$

Equation 13 represents the output of the modulator of FIG. 1 when switching transistor 13 is forward biased by switching source 10. It is apparent that under the reasonable conditions assumed the circuit of block 15 in FIG. 1 acts as a reversing switch at a rate determined by the output of switch source 10. It therefore has the characteristics of a balanced modulator. In order to maintain balanced modulator action, one other condition is necessary; namely, $$2R_1R_4=R_2R_3 \qquad (14)$$

FIG. 2 is a block schematic diagram of an alternative embodiment of a transformerless balanced modulator according to this invention. Switch source 20, signal source 21 and utilization circuit 24 are the same in character as the corresponding elements numbered 10, 11 and 14 in FIG. 1. The circuitry within broken-line box 25 constitutes the balanced modulator per se. The modulator of box 25 has elements corresponding to those in FIG. 1 similarly numbered. Operational amplifier 22 includes an inverting input point marked (−), a noninverting input point marked (+) and an output point. Input resistor $R_1$ and feedback resistor $R_2$ in FIG. 2 correspond exactly to resistors $R_1$ and $R_2$ in the circiut of FIG. 1. Resistor $R_2$ in FIG. 2 is shunted by a switching device represented by npn transistor 23, whose base electrode is connected through current-limiting resistor $R_5$ and lead A to switching source 20. Box 25 differs from box 15 of FIG. 1 in that resistor $R_6$ connects the output point of amplifier 22 to output lead C. In addition lead B is bridged to lead C by means of resistor $R_7$. Noninverting input point (+) is grounded through resistor $R_4$. Signal source 21 is connected only to inverting input point (−) and not to the noninverting input point as in FIG. 1.

The balanced modulator of FIG. 2 can be analyzed in a fashion similar to that employed above with respect to the modulator of FIG. 1. However, the details will be omitted. It can be shown that with switching transistor 23 reverse biased, the output voltage becomes $$E_C=\frac{R_6}{R_7+R_6}E_B-\frac{A}{1+A+R_2/R_1}\left(\frac{R_2E_B/R_1-V_{OFF}(1+R_2/R_1)}{1+R_6/R_7}\right) \qquad (15)$$

where the A's, E's, R's and $V_{OFF}$ have the same significance as before.

On the assumption that A is very large, neglecting for the moment $V_{OFF}$, and letting $R_2=2R_1$ and $R_6=R_8$, $$E_C=-E_B/2 \qquad (16)$$

Equation 16 corresponds exactly to Equation 9 and represents the output of the modulator of FIG. 2 when switching transistor 23 (shown as an npn type) is reverse biased by switching source 20.

It can further be shown that with switching transistor 23 forward biased into saturation, the ouput voltage becomes $$E_C=\frac{R_7}{R_7+R_6}E_B=\frac{A}{1+A}\left(\frac{V_{SAT}-V_{OFF}}{1+R_6/R_7}\right). \qquad (17)$$

Again assuming that A is very large, neglecting error terms $V_{OFF}$ and $V_{SAT}$ and letting $R_7=R_8$, Equation 17 reduces to $$E_C=E_B/2 \qquad (18)$$

Equations 16 and 18 are identical except for the algebraic sign. Therefore, the circuit of FIG. 2 also operates as a reversing switch under the control of the output of switching source 20. For balanced modulator action one additional condition is necessary; namely, $$2R_1R_6=R_2R_7 \qquad (19)$$

The overall effect of the balance modulators of FIGS. 1 and 2 is substantially the same except for a reduction in the effect of error voltages $V_{OFF}$ and $V_{SAT}$ in the modulator of FIG. 2. In a typical circuit using a commercial integrated-circuit operational amplifier (Fairchild type μA709C, for example) $V_{OFF}$ is on the order of 5.4 millivolts and $V_{SAT}$ for a typical npn junction transistor (Western Electric type 12G or 16G) is on the order of 1 to 5 millivolts.

For the transistor switch in the reverse-biased condition Equation 8 applicable to FIG. 1 can be compared with Equation 15 applicable to FIG. 2. In both equations $V_{OFF}$ is multiplied by $(1+R_2/R_1)$, but in Equation 15 it is further divided by $(1+R_6/R_7)$, a divisor of value 2 when $R_6=R_7$.

For the transistor switch in the saturated condition Equation 12 applicable to FIG. 1 can be similarly compared with Equation 17 applicable to FIG. 2. In both equations the difference between $V_{OFF}$ and $V_{SAT}$ is multiplied by $A/(1+A)$, but in Equation 17 this difference is further divided by $(1+R_6/R_7)$, a divisor of value 2 when $R_6=R_7$. Therefore, at the expense of two additional resistors $R_6$ and $R_7$ the modulator of FIG. 2 halves the effect of the error voltages in comparison with the modulator of FIG. 1. It has been found that the conditions expressed in Equations 14 and 19 are necessary to balanced modulator action, but satisfactory results are attainable at ratios of $R_2/R_1$ other than 2 as previously assumed for purposes of illustration. Both modulators provide a minimum of 40 decibels rejection for carrier and signal leak. Since the operational amplifier is already available as an integrated circuit package, it would require little effort to integrate the entire balanced modulator by adding the switching transistor and a further input connection to the basic operational amplifier integrated circuit. All resistors are preferably precision 0.1% tolerance resistors. A typical value for $R_1$ is 10,000 ohms.

The switching modulator of this invention has many useful applications not previously available in integrated circuit form. FIG. 3 is a block schematic diagram of a digital-to-analog converter employing a plurality of operational amplifier switching circuits of the type shown in blocks 15 and 25 of FIGS. 1 and 2. Block 30 represents a conventional digital data source in which serial data has been transformed into parallel word form. The individual digits are presented simultaneously on leads 31–1 through **31–*n* in the order of least to most significant, i.e., $D_n$ through $D_1$. Each of leads 31 is connected to the switching input A of a switching circuit 35 of the type previously described. The signal inputs B of switching circuits 35 are connected in common to a reference voltage source 32. According to whether the A input of an individual switching circuit 35 has a "1" or a "0" applied to it, the output C will exhibit a negative or positive voltage proportional to the voltage at the output of reference source 32. If, for example, the output of reference voltage source 32 is 2.0 volts and all switching circuits 35 have overall gains of ½, as previously assumed, then the outputs on leads C will change from −1.0 volt to +1.0 volt to correspond respectively to 1's and 0's on inputs from leads 31**.

Outputs C from switches 35 are connected through appropriate weighting resistors **36–*n* to 36–1 to the several inputs of a conventional summing operational amplifier 37. Resistors 36–1 are shown binarily weighted. The output of summer 37 is applied to utilization circuit 38**.

The summing operational amplifier functions according to the following equation $$E_{OUT}=-R\Sigma\frac{E_{IN}}{R_{IN}} \qquad (20)$$

where:

$E_{OUT}$=the summation output voltage,
$E_{IN}$=voltage at input,
R=feedback resistance, and
$R_{IN}$=weighted input resistance (a binary fraction of feedback resistance R as shown in FIG. 3).

In the present instance reference voltage source 32 is assumed to be 2.0 volts positive. Each of switching circuits 35 produces an output on lead C of −2.0/2=−1.0 volt for a "1" input and +2.0/2=+1.0 volt for a "0" input from data source 30. Assume that data source 30 produces three parallel digits to be encoded on $2^3=8$ levels. Most significant digit $D_1$ will be represented in the output of summer 37 as the product of input voltage −1.0 volt and $-2^2$ for a "1" bit, which equals +4.0 volts; and −1.0 volt times $+2^2$ for a "0" bit, which equals −4.0 volts. Similarly, the next most significant digit $D_2$ is represented in the output of summer 37 by plus or minus 2.0 volts. The least significant digit $D_3$, in this example, will be represented by plus or minus 1.0 volt. The combined output of summer 37 will be the sum of these three voltages ranging from −7.0 volts for a digital input of 000 to +7.0 volts for an input of 111 in incremental steps of 2.0 volts, as summarized in Table I below. Thus, the three input bits will be transformed into an analog output having one of eight discrete levels.

TABLE I

| Input digits | | | Multiplying factors for inputs at leads | | | Sum of multiplying factors | Summer output voltage factor ×1.0 volt |
|---|---|---|---|---|---|---|---|
| D1 | D2 | D3 | 36–1 | 36–2 | 36–3 | | |
| 1 | 1 | 1 | 4 | 2 | 1 | 7 | 7.0 |
| 1 | 1 | 0 | 4 | 2 | −1 | 5 | 5.0 |
| 1 | 0 | 1 | 4 | −2 | 1 | 3 | 3.0 |
| 1 | 0 | 0 | 4 | −2 | −1 | 1 | 1.0 |
| 0 | 1 | 1 | −4 | 2 | 1 | −1 | −1.0 |
| 0 | 1 | 0 | −4 | 2 | −1 | −3 | −3.0 |
| 0 | 0 | 1 | −4 | −2 | 1 | −5 | −5.0 |
| 0 | 0 | 0 | −4 | −2 | −1 | −7 | −7.0 |

As an alternative resistors 36 can have equal values and the weighting can be performed internally of switching circuits 35 in accordance with Equations 8, 12, 14, 15, 17 and 19 above set out. In this example in which a three-bit input is assumed, the overall gains of each of switching circuits 35–1, 35–2 and 35–3 can respectively be established at absolute values of ½, ¼ and ⅛. For the overall gain value of ½ the appropriate resistance values of $R_2=2R_1$, $R_3=R_4$ and $R_6=R_7$ have already been established in previous examples. Switching circuit 35–1 is set to these values appropriately to the choice of the switching circuit of FIG. 1 or FIG. 2.

Switching circuits 35–2 and 35–3 are set to overall gain values of ¼ and ⅛. By way of example, for the gain value of ¼ (to be used in circuit 35–2) the values of $R_3$ and $R_4$ are obtained by solving Equation 12 for the ratio $E_C/E_B=¼$ and neglecting $V_{OFF}$ and $V_{SAT}$. $R_3$ then equals $3R_4$. Substitution of $R_3=3R_4$ in Equation 14 then yields the values $R_2=\frac{2}{3}R_1$. These results may be verified by substituting these values in Equation 8. For the gain value of ⅛ (to be used in circuit 35–3) the following values are obtained: $R_3=7R_4$ and $R_2=\frac{2}{7}R_1$.

If switching circuit 25 of FIG. 2 is being used in the digital-to-analog converter of FIG. 3, the appropriate resistance values can be obtained from Equations 17 and 19 in that order and verified in Equation 15. These values are: for overall gain=½, $R_6=R_7$, $R_2=2R_1$; for gain=¼, $R_6=3R_7$, $R_2=\frac{2}{3}R_1$; and for gain=⅛, $R_6=7R_7$ and $R_2=\frac{2}{7}R_1$.

In either of the latter examples, a suitable value for $R_1$, $R_4$ or $R_7$ is 10,000 ohms. The values of the input resistors 36 for summer 37 in either case would be taken equal to each other and to the feedback resistor therein.

Figure 4:
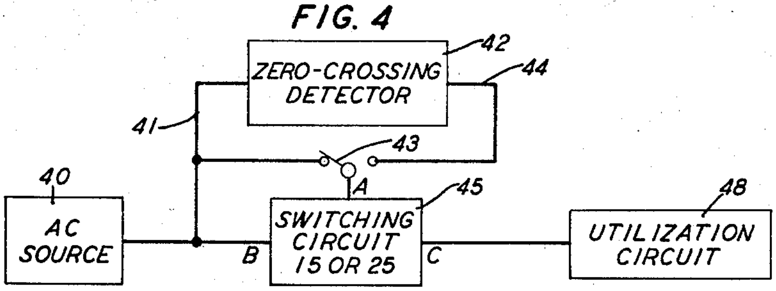
FIG. 4 is a block schematic diagram of a full-wave rectifier employing an operational amplifier switching circuit according to this invention.

FIG. 4 is a block schematic diagram of a full-wave rectifier circuit realizable through the use of the switching circuits of FIG. 1 or 2 because of the phase inversion realized therein. The full-wave rectifier comprises an alternating-current signal source 40, a switching circuit 45 and a utilization circuit 48. The output of source 40 is applied to both input points A and B of switching circuit 45, which may alternatively be switching circuit 15 of FIG. 1 or circuit 25 of FIG. 2. Positive cycles from source 40 are inverted and negative cycles are passed unchanged in polarity.

Switch 43 is provided at input A for the condition in which the derivative of the input function at zero crossings is too low to operate the switching device in circuit 45 reliably. Switch 43 may then be moved to the right to place conventional zero-crossing detector 42 in circuit with input A by way of leads 41 and 44. Switching circuit 45 is then provided with reliably fast trigger pulses.

Figure 5:
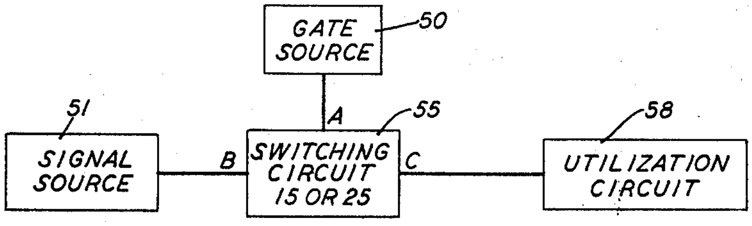
FIG. 5 is a block schematic diagram of a sampling gate circuit employing an operational amplifier switching circuit according to this invention.

FIG. 5 shows a block schematic diagram of a sampling circuit employing the operational amplifier switching circuit of this invention. The circuit of FIG. 5 is substantially the same as that of FIGS. 1 and 2, except that switching input A of switching circuit 55 has applied to it a sampling pulse train from gate source 50 rather than a square wave. Signal source 51 provides an arbitrary analog signal wave which is to be provided to utilization circuit in the form of pulse-amplitude-modulated digits. The operation is self-evident in view of the previous description.

Another application of the switching circuit of the invention not shown in the drawing is that of a gated oscillator. For this application a tuned circuit at the desired frequency is placed in series with the feedback resistor $R_2$ of FIG. 1, and both oscillator and feedback resistor are shunted by the switching transistor 13. Input resistors $R_1$, $R_3$ and $R_4$ are omitted and the noninverting input (+) is returned directly to ground. Switch source 10 can then provide a nonsymmetrical square wave. In the output there will appear a train of oscillations during negative excursions of the switching input.

What is claimed is:

1. A switching circuit comprising a high-gain operational amplifier having respective inverting and noninverting input points and an output point, a first resistance connecting said noninverting input to a ground reference point, a modulation signal source, a second resistance connecting said modulation source to said inverting input point, a third resistance connected from said output point in feedback relation to said inverting input point, a noninverting feedforward path between said modulation source and said output point, a switching device shunting said third resistance, a switching source controlling said switching device between conducting and nonconducting states, and a utilization circuit connected to said output point.

2. The switching circuit of claim 1 in which said feedforward path includes a fourth resistance connected between said modulation source and said noninverting input point, said first and fourth resistances forming a potential divider which determines the closed loop gain of said operational amplifier when said switching device is in the conducting state.

3. The switching circuit of claim 2 in which twice the product of said first and second resistances equals the product of said third and fourth resistances to cause said switching circuit to function as a balanced modulator.

4. The switching circuit of claim 1 in which said feedforward path includes fifth and sixth resistances connected in series between said modulation source and said output point, said utilization circuit is connected to the junction of said fifth and sixth resistances such that the closed-loop gain of said operational amplifier with respect to said modulation source and said utilization circuit is determined by said fifth and sixth resistances when said switching device is in the conducting state.

5. The switching circuit of claim 4 in which twice the product of said second and sixth resistances equal the product of said third and fifth resistances to cause said switching circuit to function as a balanced modulator.

6. The switching circuit of claim 1 in which said switching device is a junction transistor.

7. The switching circuit of claim 1 in which said switching source is a carrier wave oscillator.

8. The switching circuit of claim 1 in which said switching source is a pulse generator.

References Cited

UNITED STATES PATENTS

| | | | |
|---|---|---|---|
| 2,801,296 | 7/1957 | Blecher | 330—9 |
| 2,994,825 | 8/1961 | Anderson | 332—9 X |
| 3,064,208 | 11/1962 | Bullock et al. | 332—9 |
| 3,106,684 | 10/1963 | Luik | 330—9 X |
| 3,389,340 | 6/1968 | Forbes | 307—240 |

ALFRED L. BRODY, Primary Examiner

U.S. Cl. X.R.

330—95, 86, 26; 307—240